(12) United States Patent
Ramaraju et al.

(10) Patent No.: US 8,379,468 B2
(45) Date of Patent: Feb. 19, 2013

(54) WORD LINE FAULT DETECTION

(75) Inventors: Ravindraraj Ramaraju, Round Rock, TX (US); Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 57 days.

(21) Appl. No.: 13/169,397

(22) Filed: Jun. 27, 2011

(65) Prior Publication Data

US 2012/0327699 A1 Dec. 27, 2012

(51) Int. Cl.
*G11C 29/00* (2006.01)
(52) U.S. Cl. .................................. 365/201; 365/200
(58) Field of Classification Search .................. 365/201, 365/200, 230.06
See application file for complete search history.

(56) References Cited

U.S. PATENT DOCUMENTS

| | | | |
|---|---|---|---|
| 5,371,712 A | | 12/1994 | Oguchi et al. |
| 5,963,489 A | * | 10/1999 | Kirihata et al. ............... 365/200 |
| 6,037,799 A | * | 3/2000 | McClure ........................ 326/37 |
| 6,757,854 B1 | | 6/2004 | Zhao et al. |
| 6,816,396 B2 | | 11/2004 | Chai et al. |
| 7,729,185 B2 | | 6/2010 | Shirur et al. |

OTHER PUBLICATIONS

Yao, X., et al., "Single Event Transient Mitigation in Cache Memory using Transient Error Checking Circuits", IEEE, Custom Integrated Circuits Conference, 2010, pp. 1-4.
Ramaraju, R., et al., "Error Detection in a Content Addressable Memory (CAM) and Method of Operation", U.S. Appl. No. 12/813,974, filed Jun. 11, 2010.

* cited by examiner

*Primary Examiner* — Vu Le
(74) *Attorney, Agent, or Firm* — James L. Clingan, Jr.; Joanna G. Chiu

(57) ABSTRACT

In a memory having a word line driver and a ROM having N bit positions and a plurality of rows in which each row is coupled to a corresponding word line of the word line driver and stores a unique N bit value, a method includes activating, by the word line driver, a selected word line, and, for each bit position, determining whether a value of a true bit line of the bit position is at a same logic state as a value of a complementary bit line of the bit position when the word line driver activates the selected word line. In response to determining that a value of the true bit line is at the same logic state as the value of the complementary bit line for any of the N bit positions, providing a multiple word line fault indicator indicating that multiple word lines are activated simultaneously.

20 Claims, 3 Drawing Sheets

| WORD LINE ON INDICATOR | MULTI-WORD LINE ON INDICATOR | RESULT | WORD LINE FAULT |
|---|---|---|---|
| LOW | LOW | NO WORD LINE ON | YES |
| LOW | HIGH | NON TRANSIENT ERROR | YES |
| HIGH | LOW | ONE WORD LINE ON | NO |
| HIGH | HIGH | MULTI-WORD LINE ON ERROR | YES |

US 8,379,468 B2

WORD LINE FAULT DETECTION

BACKGROUND

1. Field

This disclosure relates generally to word line faults in memories, and more specifically, to word line fault detection in memories.

2. Related Art

Integrated circuits may fail in a variety of ways, and with memories continuing to be more common as at least a portion of integrated circuits, failures in memories are having a bigger impact. One of the failures in memories relates to word lines. One type of failure is that no word line is enabled when the memory is intended to be accessed. Detection for this type of failure is commonly indicated by a signal called "word line on indicator." This signal indicates whether a word line has been enabled, i.e., a word line is on. Another type of fault occurs when more than one word line is enabled in the same array. The signal that indicates this type of fault is commonly called a multi word line fault indicator. Although it is preferable that such errors do not occur, it is often the case that the integrated circuit can continue to function even with such errors but the integrated circuit needs to know about such error to continue to perform properly. Thus, it is useful if the indication of such word line faults can be achieved as quickly as possible. Also it is desirable for the circuitry detecting the faults require as little space as possible.

Accordingly, there is a need for a word line fault detector that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a multi word line fault detector portion of a word line fault detector utilizes both true and complementary outputs of an address ROM to provide an indication of more than one word line being on while still providing an indication if a single word line is on. This is better understood by reference to the drawings and the following description.

Figure 1:
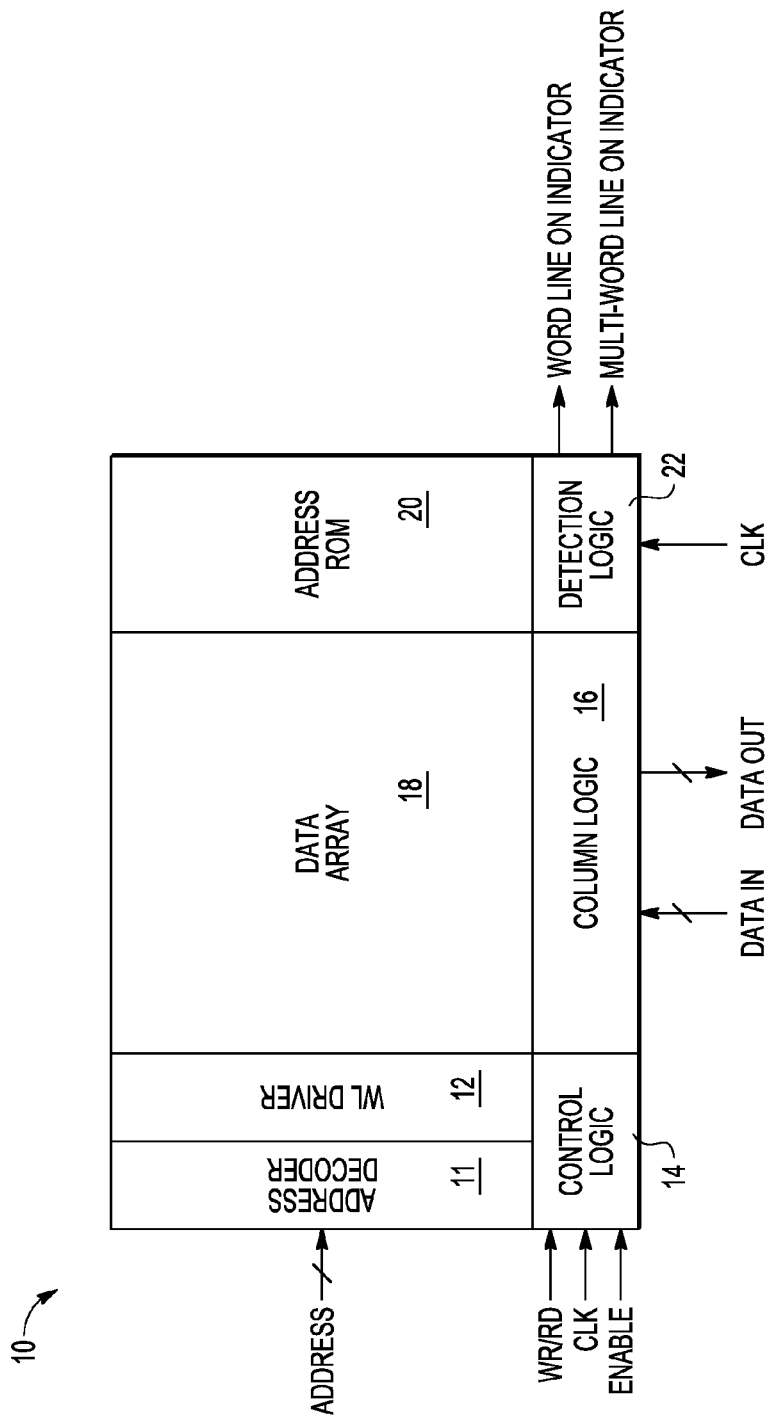
FIG. 1 is a block diagram of a memory system that includes a word line fault detector according to an embodiment.

Shown in FIG. 1 is a memory system 10 comprising an address decoder 11 for receiving an address; a word line driver 12 coupled to address decoder 11; a control logic 14 coupled to address decoder 11 and word line driver 12; a column logic 16 coupled to control logic 14; a data array 18 coupled to word line driver 12, control logic 14, and column logic 16; an address ROM 20 coupled to data array 18; and a detection logic coupled to address ROM 20. Control logic 14 receives a write/read (WR/RD) signal, a clock CLK, and an enable signal. Column logic 16 inputs data in and outputs data out. Column logic 16 may also receive address information. Detection logic 22 receives clock CLK and outputs a "word line on indicator" and a "multi word line on indicator."

In operation, control logic 14 receives the enable signal, address decoder 11 responds to the address as timed by the clock CLK to select a word line in data array 18. Word line driver 12 enables the selected word line. When a word line is enabled it is considered on. When signal WR/RD is for a write, data in is written into memory cells along the selected word line by column logic 16. When signal WR/RD is for a read, column logic outputs data out from the memory cells along the enabled word line. Address ROM 20, being coupled to the word lines of data array 18, detect the presence or absence of signals on the word lines in a particular way, and couple that information to detection logic 22. Detection logic 22 interprets the information and provides the word line on indicator and multi word line on indicator accordingly.

Figure 2:
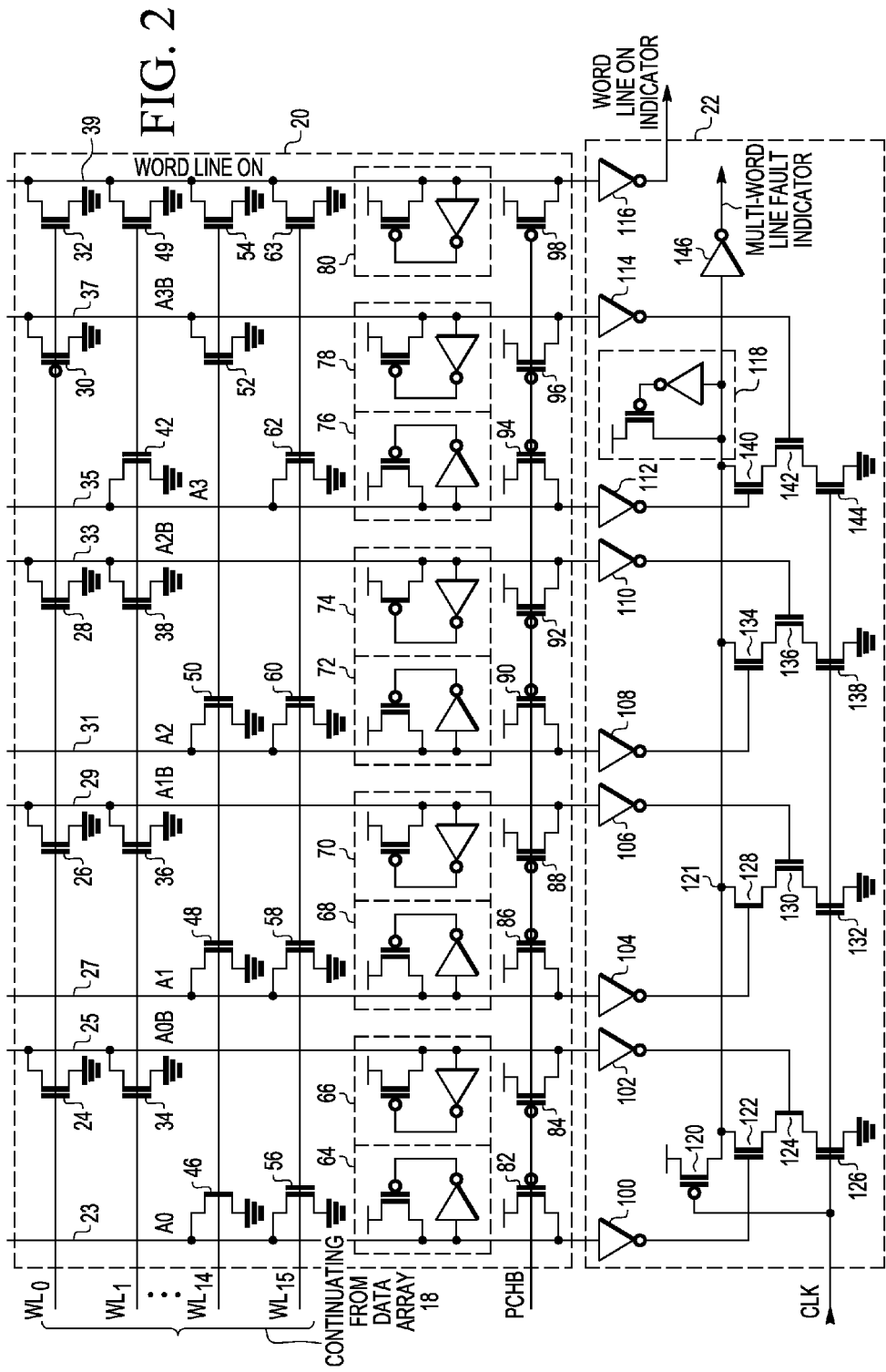
FIG. 2 is a circuit diagram of a portion of the memory system of FIG. 1 including the word line fault detector.

Shown in FIG. 2 is a circuit diagram of address ROM 20 and detection logic 22. Address ROM 20 has, in this example, 16 word lines of which four are shown, WL0, WL1, WL14, and WL15. Crossing the word lines are bit lines 23, 25, 27, 29, 31, 33, 35, 37, and 39 also identified as address A0, address A0B, address A1, address A1B, address A2, address A2B, address A3, and address A3B, and word line on, respectively. Bit lines may also be referenced by their address identifier. For example bit line 23 may be referenced as bit line A0. On the word line WL0, WL1, WL2, and WL4 are N channel transistors functioning as a ROM. N channel transistors 24, 26, 28, 30, and 32 have their gates connected to word line WL0, their sources connected to ground, and their drains connected to bit lines A0B, A1B, A2B, A3B, and word line on, respectively. N channel transistors 34, 36, 38, 40, 42, 49 have their gates connected to word line WL1, their sources connected to ground, and their drains connected to bit lines A0B, A1B, A2B, A3, and word line on, respectively. N channel transistors 46, 48, 50, 52, and 54 have their gates connected to word line WL14, their sources connected to ground, and their drains connected to bit lines A0, A1, A2, A3B, and word line on, respectively. N channel transistors 56, 58, 60, 62, and 63 have their gates connected to word line WL15, their sources connected to ground, and their drains connected to bit lines A0, A1, A2, A3, and word line on, respectively. Half latches 64, 66, 68, 70, 72, 74, 76, 78, and 80 are connected to bit lines A0, A0B, A1, A1B, A2, A2B, A3, A3B, and word line on, respectively. These half latches each comprise a P channel transistor having a source connected to a positive power supply terminal and a drain connected to the bit line to which the latch is connected and an inverter having an input connected to the bit line to which the latch is connected and an output connected to a gate of the P channel transistor. These latches function to keep a precharge voltage on the bit lines at the positive power supply voltage until one of the N channel transistors connected to the bit line becomes conductive to reduce the bit line voltage to ground. P channel transistors 82, 84, 86, 88, 90, 92, 94, 96, and 98, connected to bit lines A0, A0B, A1, A1B, A2, A2B, A3, A3B, and word line on, respectively, precharge the bit lines to which they are connected in response to a precharge signal PCHB.

Detection logic 22 includes inverters 100, 102, 104, 106, 108, 110, 112, 114, and 116, having inputs connected to bit lines A0, A0B, A1, A1B, A14, A14B, A15, A15B, and word line on, respectively. Inverter 116 has an output that provides the word line on indicator. A P channel transistor 120 has a source connected to the positive power supply terminal, a gate coupled to clock CLK, and a drain connected to a node 121. The actual signal received by transistor 120 may be different from clock CLK but in such case would be derived from it. Inverter 146 has an input connected to node 121 and an output providing the multi word line fault indicator. An N channel transistor 122 has a drain connected to node 121, a gate connected to the output of inverter 100, and a source. An N channel transistor 124 has a drain connected to the source of transistor 122, a gate connected to the output of inverter 102, and a source. An N channel transistor 126 has a drain connected to the source of transistor 124, a gate connected to the gate of transistor 120, and a source connected to ground. An N channel transistor 128 has a drain connected to node 121, a gate connected to the output of inverter 104, and a source. An N channel transistor 130 has a drain connected to the source of transistor 128, a gate connected to the output of inverter 106, and a source. An N channel transistor 132 has a drain connected to the source of transistor 130, a gate connected to the gate of transistor 120, and a source connected to ground. An N channel transistor 134 has a drain connected to node 121, a gate connected to the output of inverter 108, and a source. An N channel transistor 136 has a drain connected to the source of transistor 134, a gate connected to the output of inverter 110, and a source. An N channel transistor 138 has a drain connected to the source of transistor 136, a gate connected to the gate of transistor 120, and a source connected to ground. An N channel transistor 140 has a drain connected to node 121, a gate connected to the output of inverter 112, and a source. An N channel transistor 142 has a drain connected to the source of transistor 140, a gate connected to the output of inverter 114, and a source. An N channel transistor 144 has a drain connected to the source of transistor 142, a gate connected to the gate of transistor 120, and a source connected to ground. A half latch 118 is connected to node 121.

Transistors 122 and 124 may be referenced as a series pair 122/124, transistors 128 and 130 may be referenced as a series pair 128/130, transistors 134 and 136 may be referenced as a series pair 134/136, and transistors 140 and 142 may be referenced as a series pair 140/142. For each series pair, because there are two transistors connected in series, provides a path through the pair that is conductive only if both transistors are conductive. If either or both are non-conductive, then the path is blocked so the path is non-conductive. The bit lines of address ROM 20 are in pairs of true and complement bit lines and each true and complement pair may be referenced as a bit line position. Thus, for example, bit line A0 and A0B are the true and complement, respectively, of a bit line position that may be referenced as bit line position A0/A0B. Similarly bit lines A1 and A1B may be referenced as bit line position A1/A1B, bit lines A2 and A2B may be referenced as bit line position A2/A2B, and bit lines A3 and A3B may be referenced as bit line position A3/A3B. Each bit line position is coupled to a corresponding series pair. For example, series pair 120/122 corresponds to and is coupled to bit line position A0/A0B through inverters 100 and 102. Similarly, series pair 128/130 corresponds to and is coupled to bit line position A1/A1B through inverters 104 and 106, series pair 134/136 corresponds to and is coupled to bit line position A2/A2B through inverters 108 and 110, and series pair 140/142 corresponds to and is coupled to bit line position A3/A3B through inverters 112 and 114. A series pair is enabled when both bit lines of a bit position are on. The transistors connected to a word line can be called a row. For example transistors 34, 36, 38, 42, and 44 comprise a row corresponding to word line WL1. Transistors of a row are selectively connected to either a true bit line or the complement of the true bit line. That address ROM 20 is a ROM arises from this choice at the crossing of bit lines and word lines as to whether a transistor is placed at the true or the complement. Address ROM 20 may also be considered a word line fault detection array.

In operation, precharge signal PCHB becomes active and precharges all of the bit lines to a logic high. The half latches in address ROM 20 maintain the bit lines at the logic high. Clock signal CLK is a logic low so that transistor 120 is conductive to ensure node 121 is a logic high. Half latch 118 keeps node 121 a logic high until actively driven to a logic low. In response to clock CLK switching to a logic high, word line driver 12 enables the selected word line, in this example word line WL1, which enables transistors 34, 36, 38, and 40 which has the effect of grounding bit lines A0B, A1B, A2B, and A3. With the inputs of inverters 102, 106, 110, and 112 at a logic low, the outputs of those inverters are at a logic high which enables transistors 124, 130, 136, and 140. On the other hand inverters 100, 104, 108, and 114 are receiving logic highs on their inputs which causes inverters 100, 104, 108, and 114 to provide logic lows to transistors 122, 128, 134, and 142 which keeps them non-conductive. While clock CLK is a logic low, transistors 126, 132, 138, and 144 are blocking a possible conductive path to ground for node 121 and node 121 remains latched by half latch 118. When clock CLK switches to a logic high, transistors 126, 132, 138, and 144 become conductive providing for the possibility of node 121 transitioning to a logic low. In order for node 121 to switch to a logic low, at least one of series pairs 122/124, 128/130, 134/136, and 140/142 must be become conductive. In this example, which is the case where data array 18 operates properly in that only one word line is on, each of the series pairs remains non-conductive so that node 121 remains at a logic high so that inverter 146 provides the multi-word line fault indicator at a logic low which means that there is no more than one word line that is on. With the word line on indicator provided by inverter 116 at a logic low, the two indicators shown in FIG. 2 are indicating proper word line operation. Another possible word line failure not addressed by these two indicators is if the proper word line has been enabled which is a different issue than addressed here.

The operation can also be viewed as the output of inverters 100, 102, 104, 106, 108, 110, 112, and 114 providing an output of a logical OR operation performed on bit lines 23, 25, 27, 29, 31, 33, 35, and 37, respectively. If any bit line is enabled, which will occur if any of the transistors connected to it are enabled, then the corresponding inverter will provide a logic high. For example, transistors 46 and 56 are coupled in a wired-OR configuration on bit line 23. The other transistors on the word lines not shown that are connected to bit line 23 are also part of the wired-OR configuration. The output of inverters 100 and 102 are logically ANDed by transistors 122 and 124. Thus bit position A0/A0B has two bit lines on which each has a logical OR performed by the transistors coupled to those bit lines and the results of those logical OR operations are output to a logical AND operation. Each bit position has a similar operation to provide a result of the logical AND operation one node 121 where a logical OR operation is applied to the results of the logical AND operations and output through inverter 146.

Word lines 14 and 15 being on at the same time is an example of a case where two word lines are on at the same time. In such case, transistors 46, 48, 50, and 52 are conductive due to being enabled by word line WL14 being at a logic high, transistors 56, 58, 60, and 62 are conductive due to being enabled by word line WL15 being at a logic high. Thus bit lines A0, A1, A2, A3, and A3B are pulled to a logic low which in turn causes inverters 100, 104, 108, 112, and 114 to be at a logic high, which in turn causes transistors 122, 128, 134, 140, and 142 to be conductive. Bit lines A0B, A1B, and A2B remain at a logic low so that inverters 102, 106, and 110 provide a logic low output which in turn keeps transistors 124, 130, and 136 non-conductive. In this situation, when clock CLK switches to a logic high, there is a conductive path from node 121 to ground through transistors 140, 142, and 144. The true bit line and complement bit line of one bit line position, bit line position A3/A3B, are both pulled to a logic low thus one of the series pairs, series pair 140/142, is conductive. Thus when clock CLK switches to a logic high, node 121 transitions to a logic low which in turn causes inverter 146 to provide the multi-word line fault indicator at a logic high. The multi-word line fault indicator at a logic high is intended to mean that there is an error because more than one word line is on. In this case that is true because word lines WL14 and WL15 are on. The word line on indicator is provided at a logic high because the word line on bit line is pulled to a logic low by the transistors connected to transistors 54 and 63 being conductive due to word lines WL14 and WL15 being at a logic high.

Address ROM 20 is programmed by placing transistors at intersections of word lines and bit lines such that each row of transistors is coupled to a different combination of true and complement bit lines than any other row. The transistors are coupled to only one bit line of a bit line position. In the case of 16 word lines there needs to be 16 different combinations of bit line connections. Word line WL0 may be considered to provide a value of 0000 (0) because all four transistors are coupled to the complement. Word line WL1 may be considered to have a value of 0001 (1) because the transistor in the last bit position is coupled to the true. Word line WL14, on the other hand has a value of 1110 (14) because the first three transistors are coupled to the true and only the fourth transistor is coupled to the complement. Word line WL15 is the word line and that row has a value of 1111 (15). It is no essential that the word lines be in sequential order, but there needs to be 16 unique combinations for each row. This is why there are 4 bit line positions because 2 to the $4^{th}$ is 16 to achieve a different sequence for each word line. The result is that any time two word lines are on, there will be a bit line position in which both the true and complement are pulled to a logic low by transistors on the two rows that are on. For node 121 to be pulled to a logic low, both the true and complement must be pulled to a logic low. In the example of word lines WL14 and WL15, this was achieved by transistors 52 and 62 being enabled and pulling down bit lines A3 and A3B to a logic low. This is an efficient, from a layout and space standpoint, and fast way to achieve the indication that two word lines are on. No comparator is required which avoids the relatively slow speed of comparators compared to a simple logic function such as an AND function. The indication is achieved using a series pair, which is substantially a NAND gate, and inverter 146. The inverter also functions as a buffer. Further N channel transistors may be used. The result is an AND function.

For the case where no word line is enabled, none of the word lines are brought to a logic high and thus none of the bit lines are brought to a logic low. In such case all of the bit lines remain at a logic high which in turn results in none of the series pairs being enabled so that when clock CLK switches to a logic high, node 121 remains at a logic high causing the multi-word line fault indicator to be at a logic low indicating that there is not multiple word lines being enabled. With bit line 39 remaining at a logic high, held in that state by half latch 80, inverter 116 provides the word line on indicator at a logic low which indicates an error of there being no word line that is on.

Figures 3, 4:
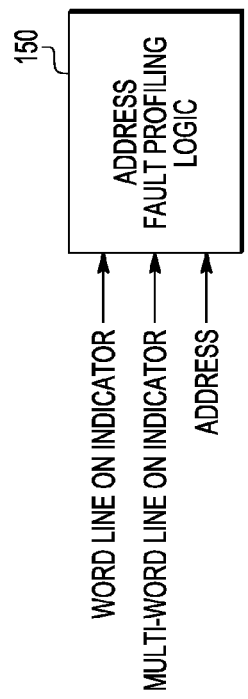
FIG. 3 is an operational table useful in understanding the operation of the word line fault detector.
FIG. 4 is a block diagram of an operational unit using outputs of the word line fault detector.

The diagram of FIG. 3 shows that address ROM 20 and detection logic 22 provide needed results for assisting in determining if a memory, such as data array 18, is functioning properly. This shows the three conditions where there is a word line fault and a fourth condition in which there is no indication of a word line fault. When the word line on indicator and the multi-word line fault indicator are a logic low, the result is that no word line is on which indicates that there is a word line fault. When the word line on indicator is a logic low and the multi-word line fault indicator is a logic high, the result is an error that is not a transient error. This would appear to not be possible because one indicator is indicating that no word line is on and the other that there are multiple word lines that are on. There is an error, but it is not the type referenced as a transient error in which during a transition of the clock there is too much delay in one path compared to another so that two word lines become activated. This error may be an indication that the error is in address ROM or detection logic 22. When the word line on indicator is a logic high and the multi-word line fault indicator is a logic low, there is no word line fault indicated. When the word line on indicator is a logic high and the multi-word line fault indicator is a logic high, that is an indication of more than one word line being enabled.

Shown in FIG. 4 is a block diagram of a circuit called address fault profiling logic 150 that can be added to memory system 10 that receives the word line on indicator, the multi-word line fault indicator, and the address. Address fault profiling logic 150 correlates the two types of fault indicators with the address. This information may used to make inferences about the source of the faults. For example, accesses to a particular word line may be the only cause of faults or a different kind of fault may occur at different locations. For example, this information can be helpful in finding weaknesses that can be prevented in future designs.

By now it should be appreciated that there has been provided a memory having an address decoder configured to receive an address and select a word line as a selected word line from a plurality of word lines. The memory further includes a word line driver coupled to the address decoder and configured to activate the selected word line. The memory further includes a read only memory (ROM) coupled to the word line driver and having N bit positions, wherein each row of the ROM is coupled to a corresponding word line from the word line driver and stores an unique N bit value, wherein N is an integer value greater than or equal to one. The memory further includes detection logic coupled to the ROM, wherein the detection logic is configured to, for each bit position of the N bit positions, determine whether a value of a first bit line of the bit position is at a same logic state as a value of a second bit line of the bit position when the word line driver activates the selected word line and configured to provide a first indicator indicative of a multiple word line fault based on whether the first bit line is at the same logic state as the second bit line for any of the N bit positions. The memory may have a further characterization by which the first bit line is further characterized as a true bit line, and the second bit line is further characterized as a complementary bit line. The memory may further include a data array coupled to the word line driver, wherein each row of the data array is coupled to a corresponding word line from the word line driver. The memory may have a further characterization by which the ROM, for each bit position of each word line, comprises a transistor at an intersection of the word line and the first bit line if the bit position is programmed to a first logic state and comprises a transistor at an intersection of the word line and the second bit line if the bit position is programmed to a second logic state, different from the first logic state. The memory may have a further characterization by which the first indicator indicates whether or not multiple word lines of the memory are activated simultaneously when the selected word line is activated. The memory may have a further characterization by which the ROM further comprises a word line on bit line, and the detection logic is configured to use a logic state of the word line on bit line to provide a second indicator indicative of whether or not at least one of the plurality of word lines of the memory is activated when the word line driver activates the selected word line. The memory may have a further characterization by which, for each word line, the ROM further comprises a transistor at an intersection of the word line and the word line on bit line. The memory may have a further characterization by which the detection logic is configured to provide a word line fault indicator to indicate occurrence of a word line fault in the memory when the first indicator indicates multiple word lines of the memory are activated simultaneously or the second indicator indicates none of the plurality of word lines of the memory is activated. The memory may further include word line fault profiling logic coupled to the detection logic and configured to determine a type of word line fault based on indications of a multiple word line fault provided by the first indicator and indications of whether or not at least one of the word lines of the memory is activated provided by the second indicator, wherein the type comprises one of a group consisting of a soft error rate fault or a transitional fault.

Also described is, in a memory having a word line driver coupled to a data array and to a read only memory (ROM), the ROM having N bit positions and a plurality of rows in which each row is coupled to a corresponding word line from the word line driver and stores a unique N bit value, wherein N is an integer value greater than or equal to one, a method including activating, by the word line driver, a selected word line. The method further includes, for each bit position of the N bit positions, determining whether a value of a true bit line of the bit position is at a same logic state as a value of a complementary bit line of the bit position when the word line driver activates the selected word line. The method further includes, in response to determining that a value of the true bit line is at the same logic state as the value of the complementary bit line for any of the N bit positions, providing a multiple word line fault indicator indicating that multiple word lines are activated simultaneously. The method may have a further characterization by which, for each bit position of the N bit positions, each of the bit line and the complementary bit line implements a dynamic OR operation. The method may have a further characterization by which the ROM further comprises a word line on bit line and the method may further include using the word line on bit line to provide a word line on indicator indicative of whether or not at least one of the word lines of the memory is activated when the word line driver activates the selected word line. The method may further include providing a word line fault indicator to indicate occurrence of a word line fault in the memory when the multiple word line fault indicator indicates that multiple word lines are activated simultaneously or the word line on indicator indicates that none of the word lines of the memory are activated. The method may have a further characterization by which the word line on bit line implements a dynamic OR operation. The method may further include, to the word line driver activating the selected word line, precharging the true bit line of each bit position, the complementary bit line of each bit position, and the word line on bit line to a predetermined voltage.

Described also, in a memory having a word line driver coupled to a data array and to a word line fault detection array, the word line fault detection array having N bit positions and a plurality of rows in which each row is coupled to a corresponding word line from the word line driver and stores a unique N bit value, wherein N is an integer value greater than or equal to one, a method including activating, by the word line driver, a selected word line. The method further includes, for each bit position of the N bit positions, performing a first logical OR operation on true bit values in the bit position of any activated word lines of the word line fault detection array to provide a first result, performing a second logical OR operation on complementary bit values in the bit position of any activated word lines of the word line fault detection array to provide a second result, and performing a logical AND operation using the first and second result of the particular bit position to obtain a third result. The method further includes using the third result for each of the bit positions to provide a multiple word line fault indicator indicative of whether or not multiple word lines are activated simultaneously when the word line driver activates the selected word line. The method may have a further characterization by which the word line fault detection array is implemented as a read only memory (ROM). The method may have a further characterization by which the word line fault detection array further comprises a word line on bit line, and the method may further comprise using the word line on bit line to provide a word line on indicator indicative of whether or not at least one of the plurality of word lines of the memory is activated when the word line driver activates the selected word line. The method may further comprise, when multiple word lines of the memory are activated simultaneously or none of the word lines of the memory are activated, providing a word line fault indicator to indicate occurrence of a word line fault in the memory. The method may have a further characterization by which for each bit position of the N bit positions, each of the bit line and the complementary bit line implements a dynamic OR operation.

Although the invention is described herein with reference to specific embodiments, various modifications and changes can be made without departing from the scope of the present invention as set forth in the claims below. For example N channel transistors were shown as forming the address ROM but the memory could be formed in a different manner. For example, there may additional uses of the address ROM that make it beneficial to be a programmable memory that is non-volatile. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   an address decoder configured to receive an address and select a word line as a selected word line from a plurality of word lines;
   a word line driver coupled to the address decoder and configured to activate the selected word line;
   a read only memory (ROM) coupled to the word line driver and having N bit positions, wherein each row of the ROM is coupled to a corresponding word line from the word line driver and stores an unique N bit value, wherein N is an integer value greater than or equal to one; and
   detection logic coupled to the ROM, wherein the detection logic is configured to:
      for each bit position of the N bit positions, determine whether a value of a first bit line of the bit position is at a same logic state as a value of a second bit line of the bit position when the word line driver activates the selected word line, and
      provide a first indicator indicative of a multiple word line fault based on whether the first bit line is at the same logic state as the second bit line for any of the N bit positions.

2. The memory of claim 1, wherein the first bit line is further characterized as a true bit line, and the second bit line is further characterized as a complementary bit line.

3. The memory of claim 1, further comprising a data array coupled to the word line driver, wherein each row of the data array is coupled to a corresponding word line from the word line driver.

4. The memory of claim 1, wherein the ROM, for each bit position of each word line, comprises a transistor at an intersection of the word line and the first bit line if the bit position is programmed to a first logic state and comprises a transistor at an intersection of the word line and the second bit line if the bit position is programmed to a second logic state, different from the first logic state.

5. The memory of claim 1, wherein the first indicator indicates whether or not multiple word lines of the memory are activated simultaneously when the selected word line is activated.

6. The memory of claim 5, wherein the ROM further comprises a word line on bit line, and the detection logic is configured to use a logic state of the word line on bit line to provide a second indicator indicative of whether or not at least one of the plurality of word lines of the memory is activated when the word line driver activates the selected word line.

7. The memory of claim 6, wherein, for each word line, the ROM further comprises a transistor at an intersection of the word line and the word line on bit line.

8. The memory of claim 6, wherein the detection logic is configured to provide a word line fault indicator to indicate occurrence of a word line fault in the memory when the first indicator indicates multiple word lines of the memory are activated simultaneously or the second indicator indicates none of the plurality of word lines of the memory is activated.

9. The memory of claim 1, further comprising:
   word line fault profiling logic coupled to the detection logic and configured to determine a type of word line fault based on indications of a multiple word line fault provided by the first indicator and indications of whether or not at least one of the word lines of the memory is activated provided by the second indicator, wherein the type comprises one of a group consisting of a soft error rate fault or a transitional fault.

10. In a memory having a word line driver coupled to a data array and to a read only memory (ROM), the ROM having N bit positions and a plurality of rows in which each row is coupled to a corresponding word line from the word line driver and stores a unique N bit value, wherein N is an integer value greater than or equal to one, a method comprising:
    activating, by the word line driver, a selected word line;
    for each bit position of the N bit positions, determining whether a value of a true bit line of the bit position is at a same logic state as a value of a complementary bit line of the bit position when the word line driver activates the selected word line; and
    in response to determining that a value of the true bit line is at the same logic state as the value of the complementary bit line for any of the N bit positions, providing a multiple word line fault indicator indicating that multiple word lines are activated simultaneously.

11. The method of claim 10, wherein, for each bit position of the N bit positions, each of the bit line and the complementary bit line implements a dynamic OR operation.

12. The method of claim 10, wherein the ROM further comprises a word line on bit line, the method further comprising:
    using the word line on bit line to provide a word line on indicator indicative of whether or not at least one of the word lines of the memory is activated when the word line driver activates the selected word line.

13. The method of claim 12, further comprising:
    providing a word line fault indicator to indicate occurrence of a word line fault in the memory when the multiple word line fault indicator indicates that multiple word lines are activated simultaneously or the word line on indicator indicates that none of the word lines of the memory are activated.

14. The method of claim 12, wherein the word line on bit line implements a dynamic OR operation.

15. The method of claim 12, further comprising:
    prior to the word line driver activating the selected word line, precharging the true bit line of each bit position, the complementary bit line of each bit position, and the word line on bit line to a predetermined voltage.

16. In a memory having a word line driver coupled to a data array and to a word line fault detection array, the word line fault detection array having N bit positions and a plurality of rows in which each row is coupled to a corresponding word line from the word line driver and stores a unique N bit value, wherein N is an integer value greater than or equal to one, a method comprising:
    activating, by the word line driver, a selected word line;
    for each bit position of the N bit positions:
       performing a first logical OR operation on true bit values in the bit position of any activated word lines of the word line fault detection array to provide a first result;
       performing a second logical OR operation on complementary bit values in the bit position of any activated word lines of the word line fault detection array to provide a second result; and
       performing a logical AND operation using the first and second result of the particular bit position to obtain a third result; and
    using the third result for each of the bit positions to provide a multiple word line fault indicator indicative of whether or not multiple word lines are activated simultaneously when the word line driver activates the selected word line.

17. The method of claim 16, wherein the word line fault detection array is implemented as a read only memory (ROM).

18. The method of claim 16, wherein the word line fault detection array further comprises a word line on bit line, the method further comprising:
using the word line on bit line to provide a word line on indicator indicative of whether or not at least one of the plurality of word lines of the memory is activated when the word line driver activates the selected word line.

19. The method of claim 18, further comprising:
when multiple word lines of the memory are activated simultaneously or none of the word lines of the memory are activated, providing a word line fault indicator to indicate occurrence of a word line fault in the memory.

20. The method of claim 16, wherein, for each bit position of the N bit positions, each of the bit line and the complementary bit line implements a dynamic OR operation.

* * * * *